US007772845B2

(12) United States Patent
Feng

(10) Patent No.: US 7,772,845 B2
(45) Date of Patent: Aug. 10, 2010

(54) QUANTUM THEORY-BASED CONTINUOUS PRECISION NMR/MRI: METHOD AND APPARATUS

(76) Inventor: Derek D. Feng, 6602 E. Paseo San Andres, Tucson, AZ (US) 85710

( * ) Notice: Subject to any disclaimer, the term of this patent is extended or adjusted under 35 U.S.C. 154(b) by 0 days.

(21) Appl. No.: 12/114,708

(22) Filed: May 2, 2008

(65) Prior Publication Data
US 2008/0272775 A1   Nov. 6, 2008

Related U.S. Application Data

(60) Provisional application No. 60/915,661, filed on May 2, 2007, provisional application No. 60/943,802, filed on Jun. 13, 2007.

(51) Int. Cl.
*G01V 3/00* (2006.01)
(52) U.S. Cl. .................. 324/309; 324/300
(58) Field of Classification Search ......... 324/300–322; 600/407–445, 544; 378/95
See application file for complete search history.

(56) References Cited

U.S. PATENT DOCUMENTS

| | | | |
|---|---|---|---|
| 3,789,832 A | 2/1974 | Damadian .................. 128/2 |
| 5,304,930 A | 4/1994 | Crowley et al. ............ 324/309 |
| 5,736,857 A * | 4/1998 | Taft ........................... 324/309 |
| 5,999,838 A | 12/1999 | Crowley et al. |
| 6,078,872 A | 6/2000 | Carson et al. .............. 702/69 |
| 6,081,119 A | 6/2000 | Carson et al. ............. 324/307 |
| 6,937,696 B1 * | 8/2005 | Mostafavi ................. 378/95 |
| 7,050,618 B2 | 5/2006 | Belykh et al. |
| 7,098,039 B1 * | 8/2006 | Lloyd et al. ............... 436/172 |
| 7,187,169 B2 | 3/2007 | Clarke et al. .............. 324/307 |
| 2004/0239323 A1 | 12/2004 | Taylor et al. |
| 2006/0186882 A1 | 8/2006 | Walsh |
| 2006/0280689 A1 | 12/2006 | Xiang et al. |
| 2007/0188171 A1 | 8/2007 | Garwood et al. |
| 2008/0091118 A1 * | 4/2008 | Georgopoulos ............. 600/544 |

OTHER PUBLICATIONS

Goodman, Joseph W., Statistical Optics, pp. 164-169, Wiley-Interscience Publication, John Wiley & Sons.
Melissinos, Adrian; Napolitano, Jim; Experiments in Modern Physics 2nd Ed. Ch. 7 pp. 251-293.

(Continued)

*Primary Examiner*—Brij B Shrivastav
(74) *Attorney, Agent, or Firm*—Hayes Soloway P.C.

(57) ABSTRACT

A method for spin magnetic resonance applications in general, and for performing NMR (nuclear magnetic resonance spectroscopy) and MRI (nuclear magnetic resonance imaging) in particular is disclosed. It is a quantum theory-based continuous precision method. This method directly makes use of spin magnetic resonance random emissions to generate its auto-correlation function and power spectrum, from which are derived spin relaxation times and spin number density using strict mathematical and physical equations. This method substantially reduces the NMR/MRI equipment and data processing complexity, thereby making NMR/MRI machines much less costly, much less bulky, more accurate, and easier to operate than the current pulsed NMR/MRI. By employing extremely low transverse RF magnetic $B_1$ field (around 0.01 Gauss), MRI with this method is much safer for patients. And, by employing continuous spin magnetic resonance emissions, NMR with this method is of virtually unlimited spectral resolution to satisfy any science and engineering requirements.

31 Claims, 8 Drawing Sheets

OTHER PUBLICATIONS

Wolf, Mandel E., Coherence Properties of Optical Fields, Review of Modern Physics, Apr. 1965 vol. 37, No. 2.

Rushworth, F.A., Tunstall, D.P.; Nuclear Magnetic Resonance Ch. 2 pp. 20-27.

Andrew, E.R., Nuclear Magnetic Resonance, 1955 pp. 16-21; Cambridge at the University Press.

Cowan, Brian, Nuclear Magnetic Resonance and Relaxation, pp. 62-67.

Bloch, F., Nuclear Induction, Physical Review, 1946, pp. 460-474, vol. 70, Nos. 7 & 8, Oct. 1 and 15.

Bloembergen, N., Purcell, E.M., Pound, R.V., Relaxation Effects in Nuclear Magnetic Resonance Absorption, Physical Review, Apr. 1, 1948, pp. 697-712, vol. 73, No. 7.

Lauterbur, P.C., Image Formation by Induced Local Interactions: Examples Employing Nuclear Magnetic Resonance, Oct. 30, 1972, State University of New York at Stoney Brook.

Bloch, F., Hansen, W.W., Packard, Martin, Nuclear Induction, Jan. 29, 1946 at Stanford University.

Purcell, E.M., Torrey, H.C., Pound, R.V., Resonance Absorption by Nuclear Magnetic Moments in a Solid, Mass. Inst. of Tech., Dec. 24, 1945.

Damadian, Raymond, Tumor Detection by Nuclear Magnetic Resonance, State University of New York, Brooklyn, Oct. 12, 1970.

Bendat, Julius S., Piersol, Allan G., Random Data Analysis and Measurement Procedures 3rd. Ed., pp. 120-135, 2003.

Born, Max, Wolf, Emil, Principles of Optics: Electromagnetic Theory of Propagation, Interference and Diffraction of Light, pp. 536-539, 1959, Pergamon Press.

Davies, G.R., Lurie D.J., Hutchison J.M.S., McCallum, S.J., Nicholson, I.: continuous-wave magnetic resonance imaging of short T2 materials: in J. Mag. Reson., 2001, [retrieved on Jul. 31, 2008], pp. 289-297. Retrieved from <URL: http://linkinghub.elsevier.com/retrieve/pii/S1090787009224560> Entire Document.

* cited by examiner

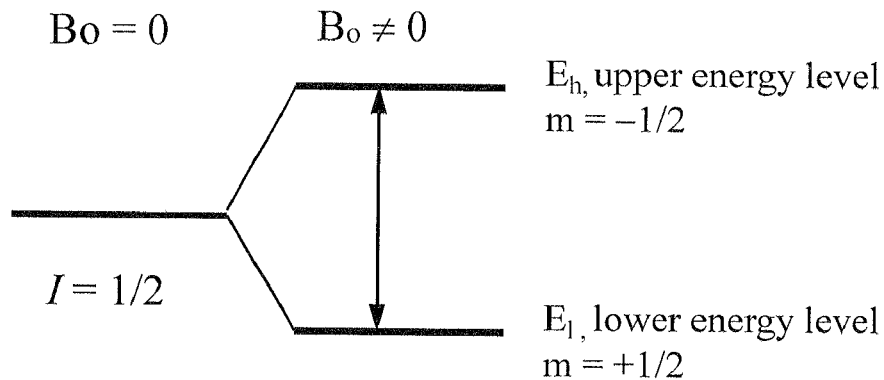
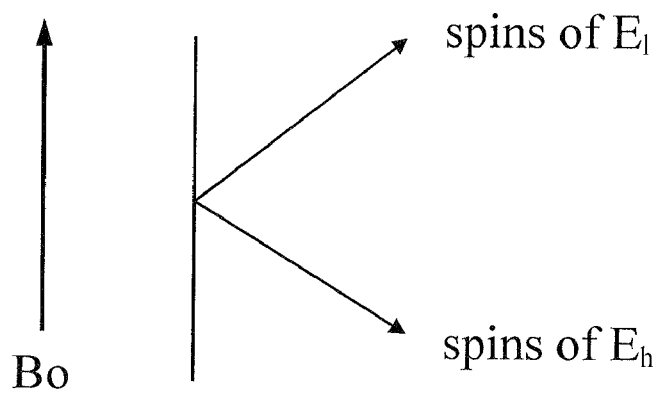
Fig.1a $^1H$ and $^{13}C$ energy levels in a magnetic field $B_o$.
spin quantum numbers I for $^1H$ and $^{13}C$ = ½,
their magnetic quantum number $m$ = +½ and -½.
Fig. 1b $^1H$ and $^{13}C$ orientation in a magnetic field $B_o$.

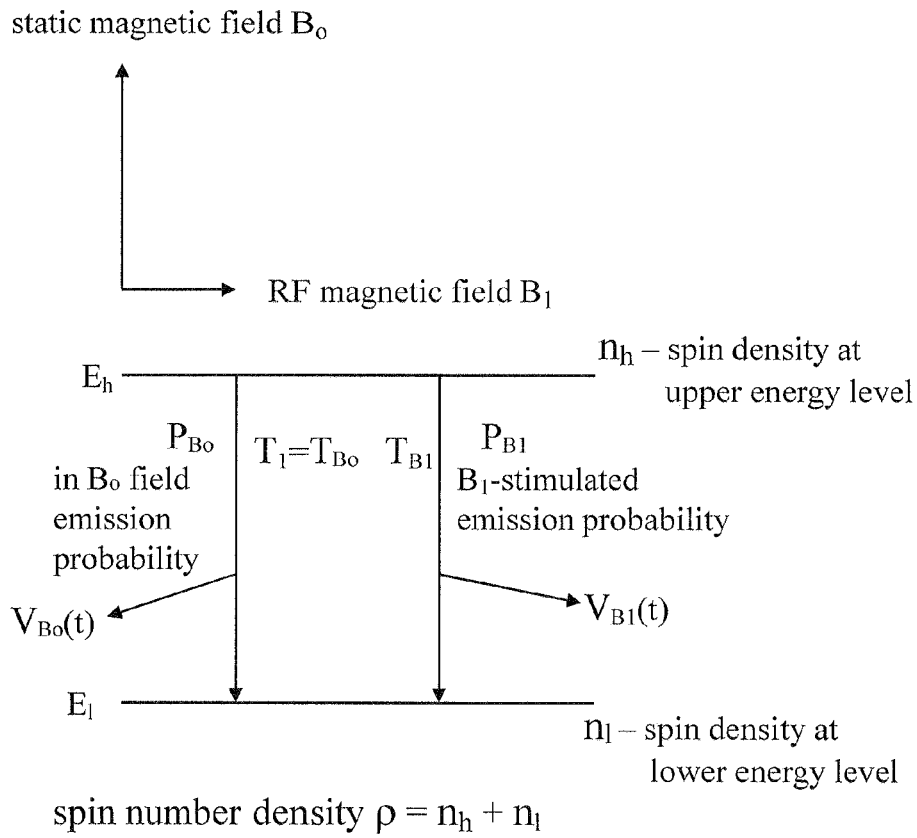
combined spin resonance transition probability $P_{SR} = P_{Bo} + P_{B1}$
combined spin resonance relaxation time $T_{SR}$, $\quad \dfrac{1}{T_{SR}} = \dfrac{1}{T_1} + \dfrac{1}{T_{B1}}$
combined spin resonance emission noise signal $V_{SR}(t) = V_{Bo}(t) + V_{B1}(t)$
Fig. 2   Spin relaxation time T, spin transition probability P, and spin emission signal V.

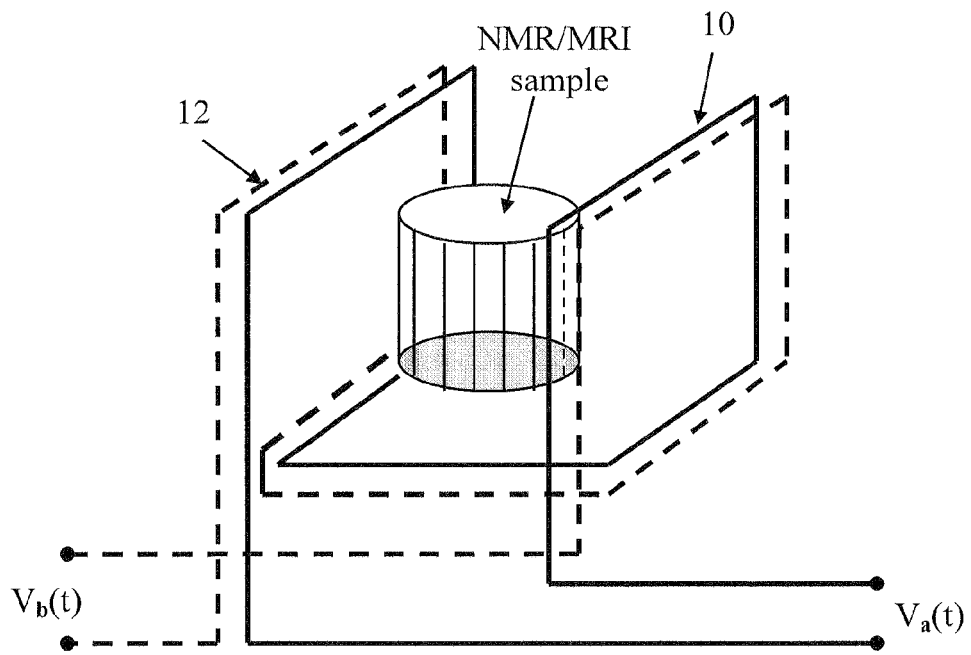
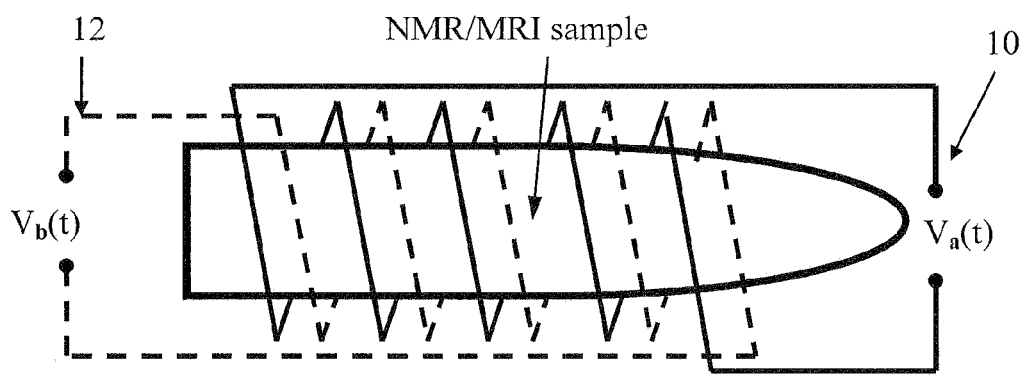
Figs. 3a and 3b NMR/MRI two identical receiver coil sets and their induced voltages $V_a(t)$ and $V_b(t)$.

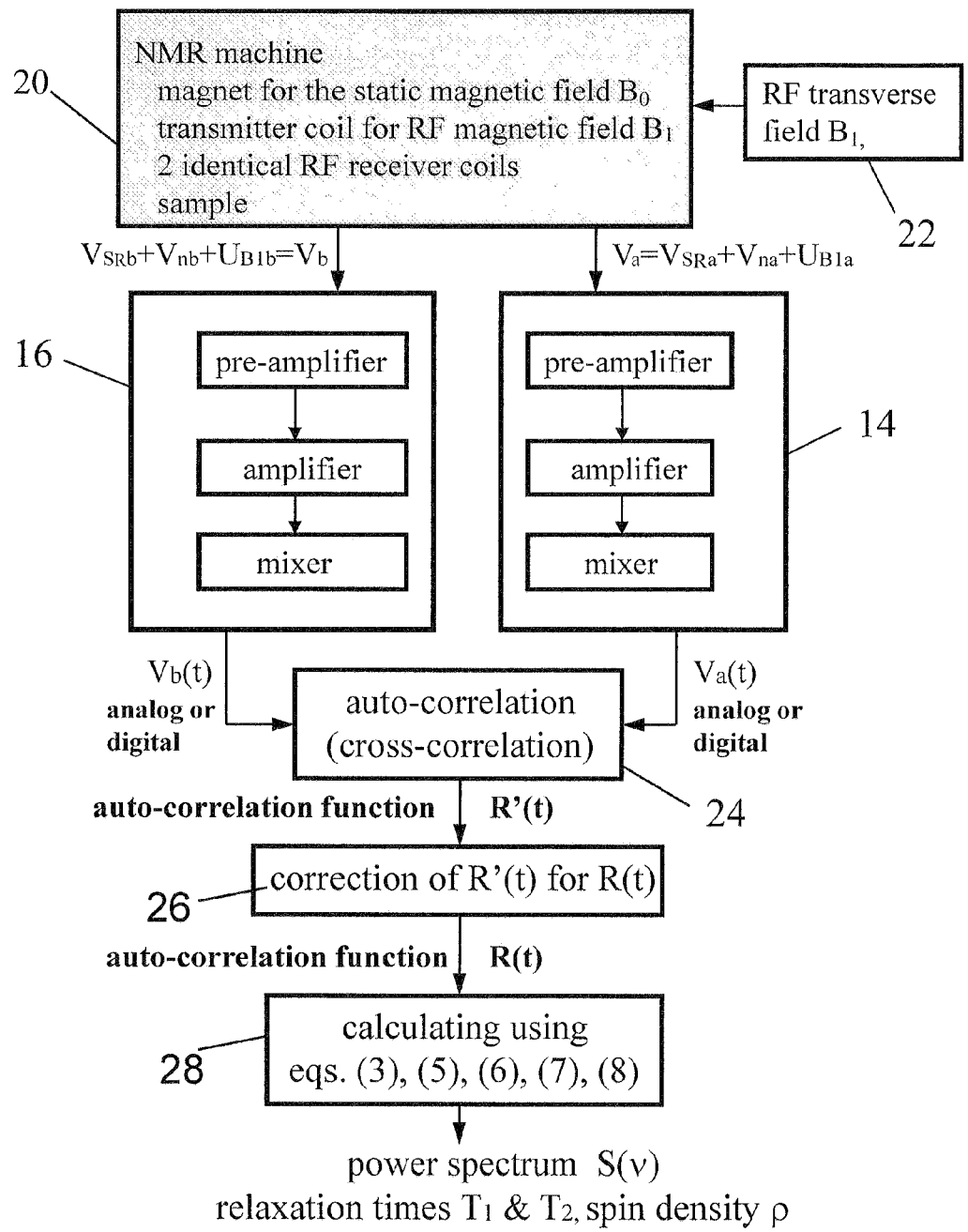
Fig. 4 NMR data acquisition, data processing, and data reduction.

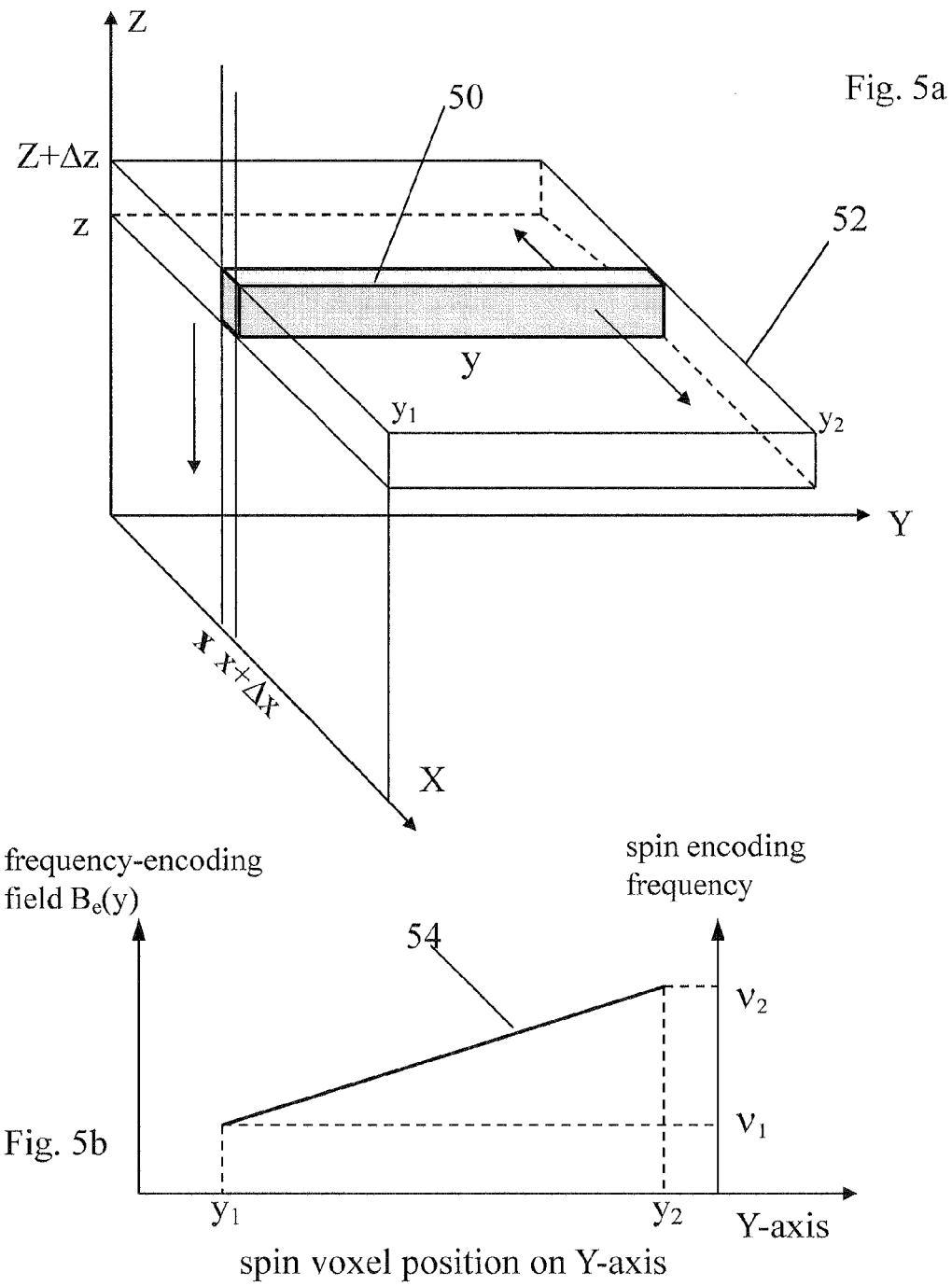
Figs. 5a and 5b  1-D frequency-encoding magnetic field $B_e$ for spin spatial localization.

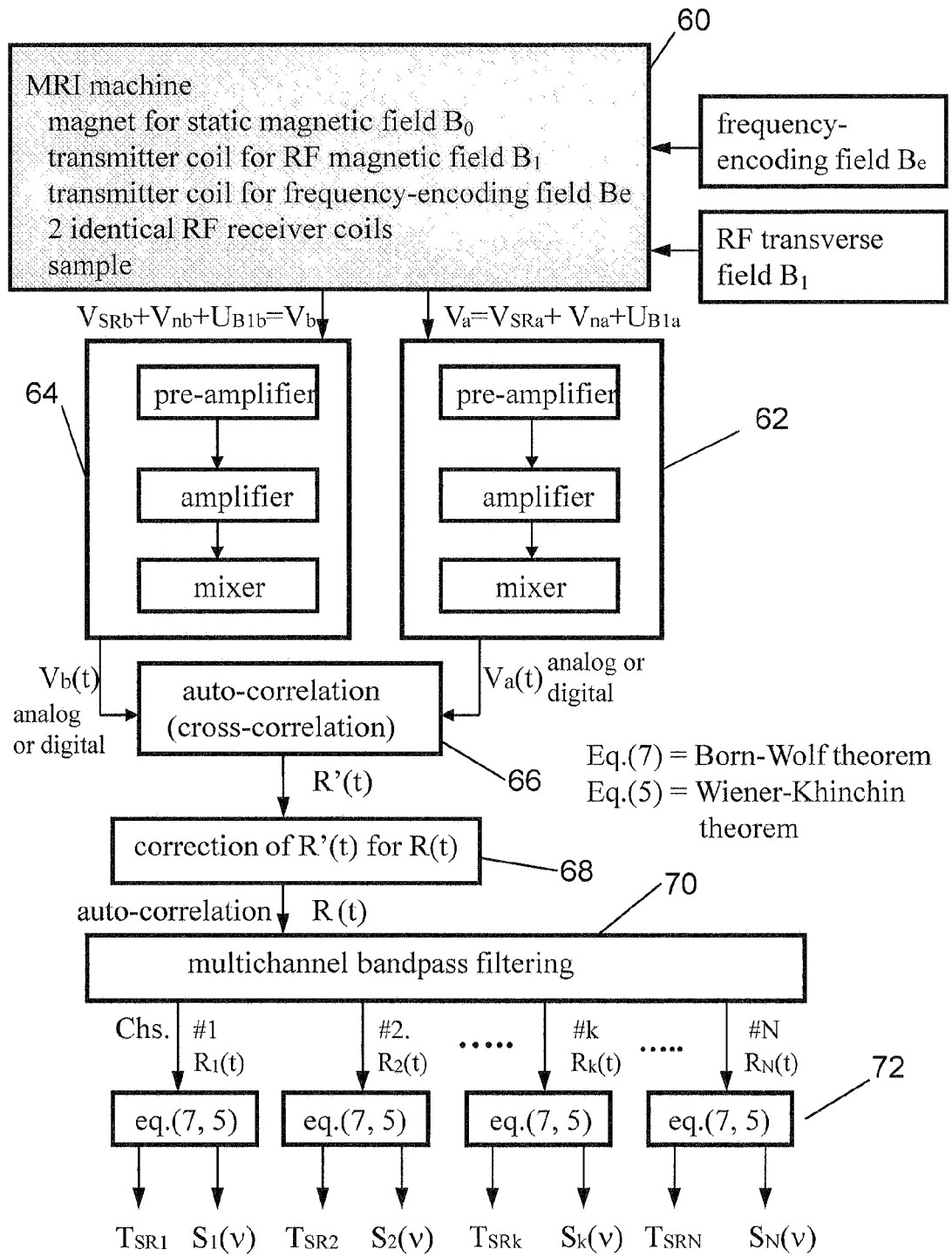
Fig. 6 MRI data acquisition, data processing, and data reduction.

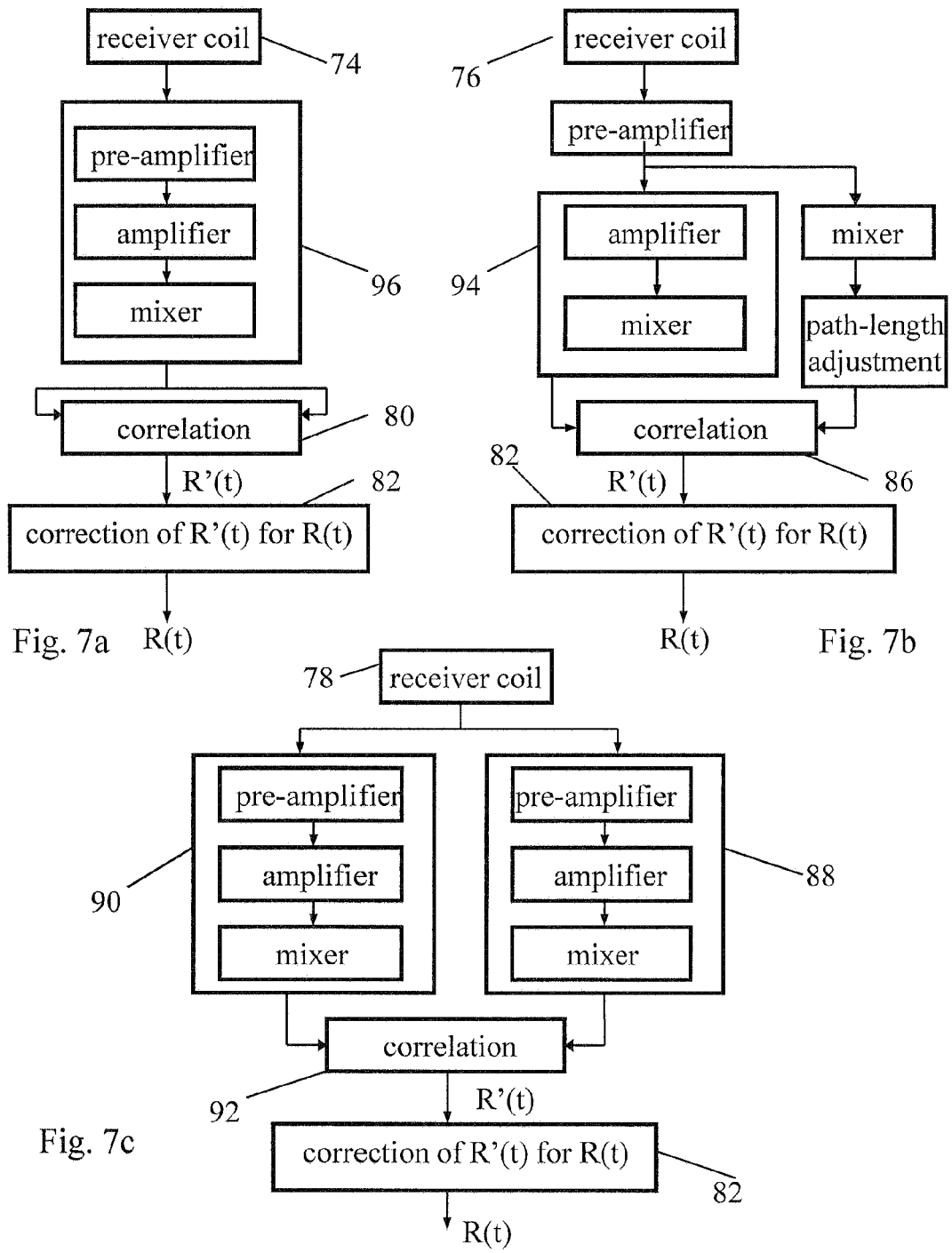
Figs. 7a, 7b, 7c  NMR/MRI using single receiver coil set.

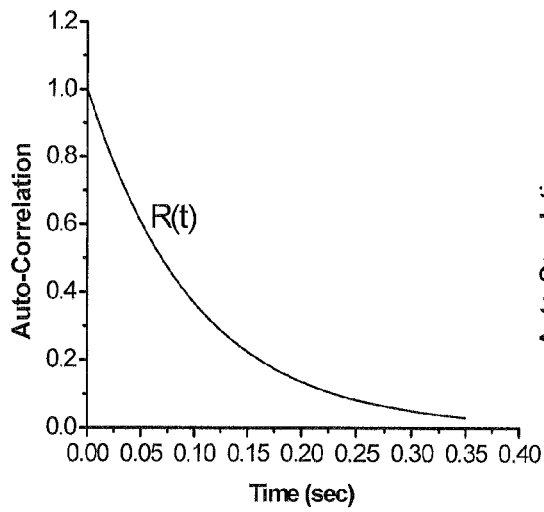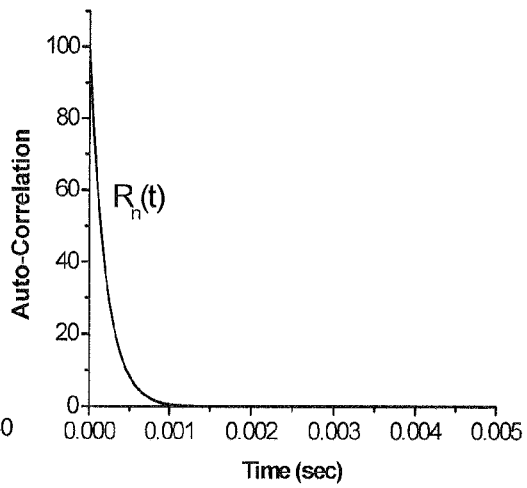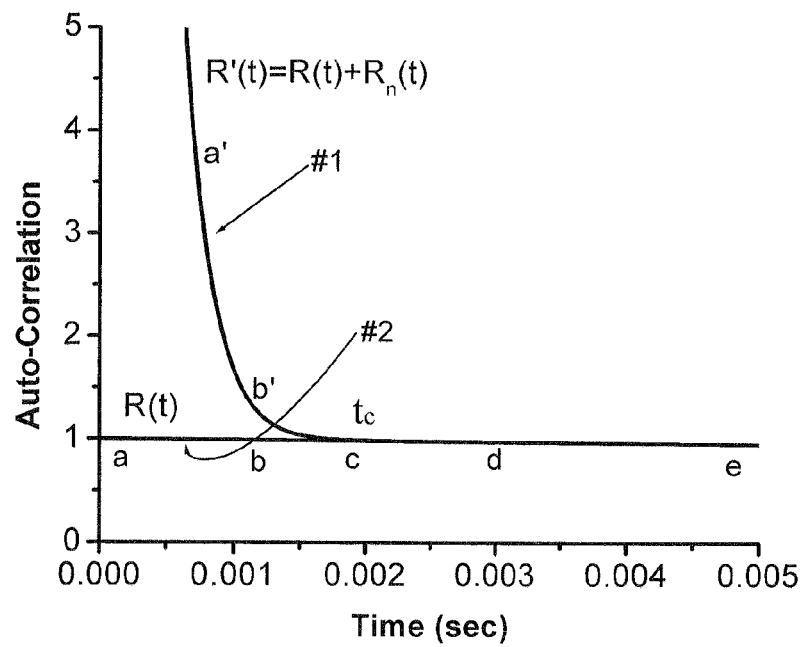
Figs. 8a, 8b, 8c  Correcting correlation function R'(t) for correlation function R(t).

QUANTUM THEORY-BASED CONTINUOUS PRECISION NMR/MRI: METHOD AND APPARATUS

CROSS REFERENCE TO RELATED APPLICATIONS

This application claims priority from U.S. Provisional Application Ser. No. 60/915,661, filed May 2, 2007 and from U.S. Provisional Application Ser. No. 60/943,802, filed Jun. 13, 2007, the contents of which are incorporated herein in their entireties.

FIELD OF THE INVENTION

This invention relates to spin magnetic resonance applications in general, and nuclear spin magnetic resonance spectroscopy (NMR)/nuclear spin magnetic resonance imaging (MRI) in particular. It describes a method and apparatus for spin magnetic resonance data generation, data acquisition, data processing, and data reduction.

BACKGROUND OF THE INVENTION

Since the discovery of nuclear spin magnetic resonance in condensed matter independently by Bloch [1] and Purcell [2] some 60 years ago, it has been rapidly evolved into a primary research and engineering technique and instrumentation in physics, chemistry, biology, pharmaceutics, etc. Particularly after pioneering work by Damadian [3] and Lauterbur [4] in the early 1970s, its developments in medicine have revolutionized diagnostic imaging technology in medical and health sciences.

Basically there are two broad categories in nuclear magnetic resonance applications. One is nuclear magnetic resonance spectroscopy (spectrometer); the other is nuclear magnetic resonance imaging (scanner). Both of them need a strong static homogenous magnetic field $B_0$. They share the same physical principles, mathematical equations, and much of data acquisition and processing techniques, but their focuses and final outcomes are different. To avoid confusion, following conventions adopted in academia and industries, in this application the acronym "NMR" will be used for nuclear magnetic resonance spectroscopy (spectrometer); and the acronym "MRI" will be used for nuclear magnetic resonance imaging (scanner). NMRs are often used in chemical, physical and pharmaceutical laboratories to obtain the spin magnetic resonant frequencies, chemical shifts, and detailed spectra of samples; while MRIs are often used in medical facilities and biological laboratories to produce 1-D (one dimensional), 2-D (two dimensional), or 3-D (three dimensional) imagines of nuclear spin number density ρ, spin-lattice relaxation time $T_1$, and spin-spin relaxation time $T_2$ of human bodies or other in vivo samples.

There have been two parallel theoretical treatments of nuclear spin magnetic resonance [5]. One, based upon quantum mechanics [5, 6], is thorough and exhaustive; the other, based on semi-classical electromagnetism [5, 7], is phenomenological. These two descriptions are complementary. The quantum mechanics descriptions can be quantitatively applied to all known phenomena in nuclear magnetic resonance; the classical theories are useful to explain most experiments in nuclear magnetic resonance except some subtle ones. Nevertheless, when it comes to practical applications, the classical theories dominate. The classical Bloch equations combined with radio frequency (RF) $B_1$ field pulses, spin and gradient echoes, spatial encoding, and free induction decay (FID) constitute much of the so-called pulsed nuclear magnetic resonance today. Modern nuclear spin magnetic resonance applications are virtually entirely theorized and formulated on classical electromagnetics [8].

SUMMARY OF THE INVENTION

This invention provides a novel system, i.e., method and apparatus for conducting NMR and MRI investigations. The basic individual equipment and hardware required by this method are much the same as those used in a conventional pulsed NMR/MRI. However, unlike conventional methods, the present invention is a continuous precision method for conducting NMR and MRI applications. It is based on quantum theories of radiation; its physics and mathematics are accurate and rigorous; it works in a continuous mode, and as such distinguishes itself over conventional pulsed NMR and MRI in almost all aspects from principles and equations to data generation, acquisition and reduction. In the practice of the present invention, magnetization M of the sample under study plays no roles, and the uses of pulses, phases, echoes, and FID are avoided. Thus, the intimate relationships between signal strength/SNR (signal-to-noise ratio) and the static field $B_o$ essentially have been eliminated. Instead what matters in this continuous method is the quantum transition probability P between two spin Zeeman energy levels in the static magnetic field $B_0$. The system sensitivity and SNR is greatly enhanced through auto/cross-correlation. Consequently, this continuous precision method is capable to be applied to both high-and low-magnetic field NMR/MRI.

BRIEF DESCRIPTION OF THE DRAWINGS

Further features and advantages of the present invention will be seen from the following detailed description, taken in conjunction with the accompanying drawings wherein like numerals depict like parts, and wherein FIG. 1a is a plot showing spin-½ energy levels in a magnetic field $B_0$;

FIG. 1b is a plot showing spin-½ spatial orientations in a magnetic field $B_0$;

FIG. 2 is a plot showing relationships between spin relaxation times, spin transition probabilities, and spin emission signals;

FIG. 3a and FIG. 3b schematically illustrate receiver coil sets in accordance with the present invention;

FIG. 4 schematically illustrates NMR data acquisition, data processing, and data reduction in accordance with the present invention;

FIG. 5a and FIG. 5b conceptually illustrate 1-D frequency-encoding magnetic field $B_e$ for spin spatial localization in accordance with the present invention;

FIG. 6 schematically illustrates MRI data acquisition, data processing and data reduction in accordance with the present invention;

FIG. 7a, FIG. 7b and FIG. 7c schematically illustrate single receiver coil embodiments in accordance with the present invention; and FIG. 8a, FIG. 8b and FIG. 8c graphically illustrate correction of correlation function in accordance with the present invention.

DETAILED DESCRIPTION OF PREFERRED EMBODIMENTS

This disclosure concerns spin magnetic resonance in general, and nuclear spin magnetic resonance spectroscopy (NMR) and nuclear spin magnetic resonance imaging (MRI) in particular, and describes and provides a system, i.e., method and apparatus, for performing nuclear spin magnetic resonance applications.

By nature, spin magnetic resonance is a quantum phenomenon. From this perspective, a novel method and technology for NMR and MRI has been developed. Its theoretical basis is the quantum theories of radiation; its physics and mathematics are accurate and rigorous; and it works in continuous mode. Consequently, this method distinguishes itself over the conventional pulsed NMR/MRI in almost all aspects from principles and equations to data generation, acquisition, processing and reduction.

As contrasted with conventional pulsed NMR and MRI, this method of invention utilizes, in a direct and natural manner, continuous stationary random noise as signals from the spin magnetic resonance transition emissions. Those, such as magnetization M, pulses, phases, echoes, free induction decay (FID), that play important roles in pulsed NMR and MRI play no roles and actually are all discarded in this continuous precision NMR and MRI. Instead, what matters in this invention is the spin magnetic resonance emission signal $V_{SR}(t)$ itself, which is continuous, stationary (ergodic), and random. According to the present invention, this random signal $V_{SR}(t)$, in its original appearance and without any manipulations, can be explored to reveal rich information on spin resonance spectrum $S(\nu)$, spin number density $\rho$, and relaxation times $T_1$ and $T_2$.

Two key functions in this invention are the auto-correlation function $R(t)$ and the power spectrum $S(\nu)$ of the spin magnetic resonance random emissions. From $R(t)$ and $S(\nu)$, other NMR or MRI parameters can be derived using Eqs. (3, 6, 7 and 8) as will be discussed below. The Wiener-Khinchin theorem, Eq.(5), relates $R(t)$ to $S(\nu)$. From $R(t)$ to $S(\nu)$ is a forward Fourier transform; while from $S(\nu)$ to $R(t)$ is an inverse Fourier transform. Therefore, either $R(t)$ or $S(\nu)$ can be firstly obtained from the spin emission random signal $V(t)$. There are various ways and commercially available computer software to calculate $R(t)$ and $S(\nu)$ [12]. In this invention disclosure, the correlation function $R(t)$ is first obtained from spin resonance noise signal $V(t)$, then Eq.(5) yields $S(\nu)$. In this sequence, the non-spin signal random noises in $V(t)$ can be eliminated in the auto/cross-correlation operation. If firstly obtaining $S(\nu)$ from $V(t)$ and secondly obtaining $R(t)$ from $S(\nu)$ with an inverse Fourier transform, this $S(\nu)$ is contaminated by all non-spin signal noises and other unwanted signals.

Auto/cross-correlation needs two signals as its inputs, and outputs their auto/cross correlation function. For this purpose, a unique, two identical sets of receiver coils may be employed in this invention. FIGS. 3a and 3b as will be described below in greater detail conceptually depict these twin sets of coils, showing two possible configurations. These two sets of receiver coils are placed together surrounding the NMR/MRI sample, generating two voltages $V_a(t)$ and $V_b(t)$ at the two sets of coil terminals. $V_a(t)$ and $V_b(t)$ in fact contains the spin resonance emission signal noise $V_{SRa}(t)$ and $V_{SRb}(t)$, other electronic random noises $V_{Na}(t)$ and $V_{Nb}(t)$, and the RF $B_1$ field-related voltage $V_{B1a}(t)$ and $V_{B1b}(t)$. $V_{Na}(t)$ and $V_{Nb}(t)$ are going to be cancelled out in cross-correlation operation, because of their statistical independency. $V_{SRa}(t) = V_{SRb}(t)$; $V_{B1a}(t) = V_{B1b}(t)$. $V_{B1a}(t)$ and $V_{B1b}(t)$ are not random. They cannot be eliminated in the correlation operation, but their contributions to the contaminated auto-correlation function $R'(t)$ can be removed in the "correction of $R'(t)$ for $R(t)$" shown in FIGS. 4, 6, and 7a-7c as will be discussed below in greater detail.

The possible NMR and MRI embodiments of this method of invention are sketched out in FIGS. 4 and 6 for the double sets of receiver coils and in FIGS. 7a-7c for the single set of receiver coils. The single set of receiver coils in this invention may be the same as that used in the conventional pulsed NMR/MRI. The embodiments with a single set of coils of FIGS. 7a-7c take less hardware, but elimination of non-spin signal noises with correlation is not possible (FIG. 7a) or only partially possible (FIGS. 7b and 7c). The removal of these non-spin signal noises takes place in the "Correction of $R'(t)$ for $R(t)$" function block (FIGS. 7a-7c).

The transverse RF magnetic field $B_1$ in this invention is necessary for measurements of the relaxation time $T_2$. In case no relaxation time $T_2$ is demanded, NMR/MRI measurements can be carried out either with or without the $B_1$ field. This RF field $B_1$ has to be continuous and steady. Applying this RF field $B_1$ alters the spin ensemble into another dynamic equilibrium state through stimulating extra spin resonance transitions with probability $P_{B1}$. As such the RF field $B_1$ may also be considered as an effective way to enhance spin signal strength. Depending upon the values of $T_1$ and $T_2$ and gyromagnetic ratio $\gamma$ of the sample, usually a very weak $B_1$ is desired. In medical MRI applications, $B_1$ may be on the order of 0.01 Gauss.

The primary outcomes of this NMR/MRI operating method are the spin magnetic resonance emission power spectrum $S(\nu)$, spin number density $\rho$, relaxation times $T_1$ and $T_2$, and their images. All these parameters represent their true values, not the so-called "weighted" $\rho$, "weighted" $T_1$, and "weighted" $T_2$.

Through using a weak RF field $B_1$ to augment the strength of the spin emission signals and using auto/cross-correlation to diminish the non-spin signal noises, this invention not only makes high static magnetic field $B_o$ unnecessary, but also use fewer hardware and software. Consequently, NMR/MRI machines with this method are much less-costly, much less-complex, much less-bulky, and safer, more accurate, higher spectral resolution, easier to operate than the current pulsed NMR/MRI, thus bringing about broad applications to science, including medical science, and engineering.

The descriptions of the pulsed NMR and MRI are in terms of the magnetization vector M of material under study in a static magnetic field $B_0$, its precession about the field $B_0$, and the free induction decay (FID) signals. The descriptions of the quantum theory-based continuous NMR and MRI of this invention are in terms of the spin population distributions, the Zeeman splitting of spin energy in the magnetic field $B_0$, the spin transition probabilities between the Zeeman energy levels, and the spin magnetic resonance random emission noise.

Every atom possesses a nucleus. Each nucleus is composed of proton(s) and neutron(s), except ordinary hydrogen nucleus $^1H$ that holds only one proton and no neutron. If a nucleus has at least one unpaired proton or neutron, its mechanical spin about an axis gives rise to a spin magnetic moment $\mu = \gamma h \sqrt{I(I+1)}/2\pi$, where $\gamma$ and $h$ are known as the spin gyro-magnetic ratio and Planck's constant, respectively. Letter I denotes the spin quantum number. The most frequently used nucleus in MRI seems to be proton $^1H$; the most frequently used nuclei in NMR seem to be proton $^1H$ and carbon-13 $^{13}C$. Spin quantum number I of $^1H$ and $^{13}C$ is both equal to ½. The gyro-magnetic ratio $\gamma$ of $^1H$ and $^{13}C$ equals $2.675 \times 10^8$ rad sec$^{-1}$ Tesla$^{-1}$ and $6.729 \times 10^7$ rad sec$^{-1}$ Tesla$^{-1}$, respectively.

Magnetic spins do not have any preferred spatial orientation in a zero-magnetic field environment. When an ensemble of nuclear magnetic spins is placed in the static magnetic field $B_o$ whose direction is designated as the z-axis of a Cartesian coordinate system, the originally-degenerate spin magnetic energy levels split into (2I+1) equally separated Zeeman energy levels. For $^1$H or $^{13}$C case I=½, there are only (2I+1)=2 Zeeman levels. The high energy (upper) level is $E_h$ and the low energy (lower) level is $E_l$, as shown in FIG. 1a. Accompanying the energy splitting, spatial quantization of the spins takes place. Those spins of energy $E_l$ align themselves towards the positive $B_o$ direction; while those spins of energy $E_h$ align themselves towards the negative $B_o$ direction (FIG. 1b). When thermal equilibrium establishes, spin number density $n_h$ at the upper level and spin number density $n_l$ at the lower level satisfy the Boltzmann distribution: $n_h/n_l=\exp(-\gamma hB_o/2\pi k_B T)$, where h is Planck's constant; and $k_B$ and T denote Boltzmann's constant and spin temperature, respectively. Although always $n_l > n_h$, $n_l$ is almost equal to $n_h$, meaning $(n_l-n_h)/(n_h+n_l)$ is a very small number no matter how strong the $B_0$ field would be in a typical laboratory environment. The difference $(n_l-n_h)$ depends upon the strength of $B_0$. Larger Bo results in larger $(n_l-n_h)$, and larger $(n_l-n_h)$ in turn results in a larger magnetization M of the sample and a higher Larmor frequency. This is one of the main reasons that the pulsed NMR/MRI tends to utilize a higher $B_o$. The present invention does not use the magnetization M and the difference $(n_l-n_h)$, so a higher $B_o$ field does not necessarily mean better NMR/MRI performance.

Although in thermal equilibrium, the higher- and lower-level spin number densities $n_h$ and $n_l$ remain in steady state as long as field $B_o$ and temperature T remain unchanged, the spins at the upper energy level continuously, due to the spin-lattice interactions, transit to the lower energy level with a transition probability $P_{Bo}$ and vice versa, so that statistically $dn_h/dt=dn_l/dt=0$. This is referred to as "dynamic equilibrium". Each spin higher-to-lower level transition accompanies an emission of a photon of angular frequency—the Larmor frequency—$\omega_0=\gamma B_o$ (the linear frequency $\nu=\omega/2\pi$ in Hertz.) Each such emission of a photon induces a microscopic voltage at the terminals of nearby detection devices (receiver coils) that surround the sample in study. Adding up all these emissions, macroscopic spin magnetic resonance emission signals are established. This process is a random process. The established signals appear in the form of stationary (ergodic) random noise. These noises are intrinsically weak, yet measurable with modern electronics. The time sequence of this noise constitutes the continuous stationary random noise signal $V_{Bo}(t)$ of the nuclear spin magnetic resonance emissions at receiver coil's output terminals.

The above spin resonance random emissions in the magnetic field $B_o$ occur in a natural and continuous manner, no matter whether the transverse RF magnetic field $B_1$ presents or not. From quantum mechanics view, the role of the transverse RF field $B_1$ at the Larmor frequency is to stimulate extra random emissions with transition probability $P_{B1}$ between the same two spin Zeeman energy levels, resulting in an extra spin resonance emission noise signal $V_{B1}(t)$. Because of the statistical independency between the emissions due to $B_o$ and due to $B_1$, provided that $B_o$ and $B_1$ both are present, the total spin resonance transition probability $P_{SR}=P_{Bo}+P_{B1}$, and the combined spin magnetic resonance emission noise signal $V_{SR}(t)=V_{Bo}(t)+V_{B1}(t)$ (FIG. 2). If being analyzed properly, this time sequence of the spin resonance emission random noise signal of $V_{SR}(t)$ would reveal rich and detailed information on the spin transition probabilities, relaxation times, resonance spectra, etc.

The transition probability P governs the transition rate between two energy levels (FIG. 2). The dimension of P is 1/second, its reciprocal is the relaxation time T (sec), i.e., T=1/P. The reciprocal of $P_{Bo}$ is the spin-lattice relaxation time $T_1$, the reciprocal of $P_{B1}$ is relaxation time $T_{B1}$ ($T_{B1}$ is not the spin-spin relaxation time $T_2$), and the reciprocal of $P_{SR}$ is relaxation time $T_{SR}$. Since $P_{SR}=P_{Bo}+P_{B1}$, so $1/T_{SR}=1/T_1+1/T_{B1}$ (FIG. 2).

If the spin number density at the upper energy level is $n_h$ and its corresponding transition probability is P, the number of transitions from the upper level to the lower level per second equals $n_h \times P$. Then the resonance emission power W(t) may be expressed as $W(t)=h\nu_0 n_h P$, here h and $\nu_0$ represent Planck's constant and the Larmor frequency. W(t) is proportional to the squared noise voltage V(t). Thus increasing P leads to a greater resonance noise signal V(t).

As long as field $B_o$ and temperature T remain unchanged, the probability $P_{Bo}$ and the spin-lattice relaxation time $T_1$ remain constant. When the field $B_1$ is applied, as described below, the probability $P_{B1}$ varies with $B_1$ squared. Comparing with the RF field $B_1$, the static magnetic field $B_o$ takes very mildly roles in increasing or decreasing its spin transition probability $P_{Bo}$.

At the Larmor frequency, the $B_1$-stimulated Zeeman transition probability is denoted by $P_{B1}$. Provided that the field $B_1$ is much weaker than the field $B_o$ (this is always the case in NMR and MRI), its effect on the spin energy Hamiltonian can be considered as a perturbation. Then the standard quantum mechanics perturbation theory applies, resulting in an expression relating the spin-spin relaxation time $T_2$ and field $B_1$ to the $B_1$-stimulated transition probability $P_{B1}$ [9, 10, 17]:

$$P_{B1} = \frac{1}{2}\gamma^2 B_1^2 (I+m)(I-m+1)T_2, \quad (1)$$

where again $\gamma$ and I are the gyro-magnetic ratio and the spin quantum number, respectively. Symbol m is the spin magnetic quantum number. For all I=½ (then m=½) nuclei, such as proton ($^1$H), carbon-13 ($^{13}$C), or phosphorus-31 ($^{31}$P), the above equation reduces to [9]

$$P_{B1} = \frac{1}{2}\gamma^2 B_1^2 T_2, \quad (2)$$

When both the static field $B_0$ and the transverse RF field $B_1$ at the Larmor frequency applied, because of statistical independency, the composite spin resonance transition probability $P_{SR}=P_{Bo}+P_{B1}$. Therefore, in terms of relaxation times, $$\frac{1}{T_{SR}} = \frac{1}{T_{Bo}} + \frac{1}{T_{B1}} = \frac{1}{T_1} + \frac{1}{2}\gamma^2 B_1^2 T_2, \quad (3)$$

where $T_1$ and $T_2$ are the spin-lattice and spin-spin relaxation times, respectively.

Eq.(3) is a key equation in this invention that establishes the relationship among a priori known field $B_1$, quantity $T_{SR}$, and the relaxation time $T_1$ and $T_2$. When both $B_0$ and $B_1$ presented, the composite spin magnetic resonance signal $V_{SR}(t)=V_{Bo}(t)+V_{B1}(t)$. The noise signal $V_{Bo}(t)$ contains information on the relaxation time $T_1$; the noise signal $V_{B1}(t)$ contains information on the relaxation time $T_2$. The combined continuous stationary random noise signal $V_{SR}(t)$, whose relaxation time is $T_{SR}$, contains information on both $T_1$ and $T_2$.

Assume a stationary random time signal V(t), which may represent $V_{Bo}(t)$ or $V_{B1}(t)$ or $V_{SR}(t)=V_{Bo}(t)+V_{B1}(t)$, its auto-correlation function R(t) is defined as $$R(t) = \lim_{T\to\infty} \frac{1}{T} \int_0^T V(\tau)V(t+\tau)d\tau \quad (4)$$

R(t) is a real-valued even function, R(t)=R(-t). After this auto-correlation function, the power spectrum S(v) and relaxation time T of the signal V(t) can be strictly derived with two mathematical theorems:

(1) The Wiener-Khinchin theorem, which states that the power spectrum S(v) of a time function V(t) is the Fourier transform of its auto-correlation function R(t) [11,12], $$S(v) = \int_{-\infty}^{+\infty} R(t)\exp(-j2\pi tv)d\tau, \quad (5)$$

where $j=(-1)^{1/2}$, v is frequency. Once having the power spectrum S(v), spin resonance frequency $v_0$ can be found as [13]

$$v_o = \frac{\int_0^\infty S^2(v)dv}{\int_0^\infty S^2(v)dv}. \quad (6)$$

(2) The Born-Wolf theorem, which defines the relationship between the relaxation (coherence) time of T of a time-domain function V(t) and its auto-correlation function R(t), [13,14]

$$T = \left[\frac{\int_0^\infty t^2 R^2(t)dt}{\int_0^\infty R^2(t)dt}\right]^{\frac{1}{2}}. \quad (7)$$

This is another key equation in this invention, since it furnishes an exact way to calculate the relaxation time T.

In addition to the spin relaxation times $T_1$ and $T_2$, spin number density ρ is also a fundamental parameter in NMR/MRI applications. The spin density ρ can be derived from the spin transition probability P and the spin resonance power spectrum S(v) at the resonance frequency $v_0$, since $S(v_0)=c\times\rho\times P$, where c is a calibration factor. Usually the relative spin number density ρ is requested, which leads to the following expression:

Relative spin number density $$\rho = \frac{S(v_0)}{P} = S(v_0) \times T. \quad (8)$$

Here P and T may represent either $P_{B0}$ and $T_1$ when only $B_0$ exists, or $P_{SR}$ and $T_{SR}$ if $B_1$ is applied. In cases the absolute spin number density ρ is demanded, the calibration factor c has to be evaluated.

The above six equations (3, 4, 5, 6, 7 and 8) are the basis of data analysis and data reduction in this invention. In short, after acquisition of the spin magnetic resonance noise signal $V_{SR}(t)$, the spin resonance power spectrum S(v), resonance frequency $v_0$, spin number density ρ, as well as the relaxation times $T_{SR}$ can all accurately be calculated by making use of Eqs. (3, 4, 5, 6, 7 and 8). Without the field $B_1(B_1=0)$, $V_{SR}(t)=V_{Bo}(t)$, $P_{SR}=P_{Bo}$, $T_{SR}=T_{Bo}=T_1$; with the field $B_1$, $V_{SR}(t)=V_{Bo}(t)+V_{B1}(t)$, then according to Eq.(3) $T_{SR}$ depends upon $T_1$ and $T_2$. Two sets of measurements at two different values of $B_1$ (one $B_1$ may be equal to 0) yield two $T_{SR}$ and thus two equations (3), they can be solved simultaneously for $T_1$ and $T_2$.

The parameters ρ, $T_1$, and $T_2$ calculated here from the above equations and procedures are their "true" values. They are different from the so-called "weighted" $T_1$, $T_2$, or ρ in the pulsed NMR/MRI.

Eq.(7) is actually not the only formula for calculating the relaxation time T of signal V(t) from its auto-correlation function R(t). There could have other mathematical forms accomplishing the same task. For instance, Goodman [15] defines the relaxation time T using the following formula:

$$T = \int_{-\infty}^{\infty} |R(\tau)|^2 d\tau. \quad (9)$$

Both Eq.(7) and Eq.(9) can be used for determining relaxation time T. Eq.(9) is simpler, but Eq.(7) asserts to be of more physical insight. In this invention, calculations of relaxation times are based on Eq.(7).

1. The Transverse RF (Radio-Frequency) Magnetic Field $B_1$

Similar to pulsed NMR/MRI, this invention employs a transverse (in the x-y plane) RF (radio-frequency) magnetic field $B_1$ generated by a transmitting coil set. But what differs over the RF field $B_1$ in the pulsed NMR/MRI is that in the present invention this is a continuous (not pulsed) and very weak $B_1$ field. It is a broadband (much broader relative to the bandwidths of spin resonance emission lines) alternating magnetic field. Because of the continuous working mode, some of the RF magnetic field $B_1$ would inevitably be intercepted by the receiver coils and induce some extra voltage $U_{B1}(t)$. Then this $U_{B1}(t)$ together with the spin resonance emission noise signal $V_{SR}(t)$ is fed up to the following electronics by the receiver coils. $U_{B1}$ is unwanted interference to $V_{SR}$. Thus, it should be suppressed to a minimum level possible. Three individual measures may be applied to virtually eliminate this $U_{B1}$ interference: (1) mechanically constructing receiver coil(s) with special design, installation, and alignment. One arrangement is to make the receiver coil set perpendicular (90 degrees) to the transmitter coil set in order to null the cross-coupling or leaking between them. By this orthogonality, the cross-coupling between the transmitter and receiver coils can be limited to no more than 1%; (2) electronically using some special compensation circuits; and (3) numerically applying some correction techniques to finally eliminate this $U_{B1}$ effects. The descriptions of this third measure will be presented later in greater details.

In addition to the fraction of the $B_1$ field power directly deposited to the receiver coils due to cross-coupling, there is a possible secondary effect due to the RF $B_1$ field. The $B_1$ field generated originally by the transmitter coils can cause some electromagnetic disturbances in the sample volume. Portions of these disturbances possibly may feed back to the receiver coils inducing some secondary $U_{B1}$ (back action effect). In the following description, when $U_{B1}$ is referred to, it always means the sum of these $U_{B1}$ from the direct and the secondary effects.

2. The Receiver Coils for Spin Magnetic Resonance Random Emissions

This continuous NMR/MRI method makes use of two kinds of receiver (detection) coils. One is to use two identical sets of receiver coil to generate two identical spin resonance emission noise signals $V_{SRa}(t)$ and $V_{SRb}(t)$. The other one is to use a single receiver coil set, the same as the one in the pulsed NMR/MRI, to generate a single spin resonance emission noise signal $V_{SR}(t)$. FIGS. 3a and 3b illustrate these dual sets of receiver coils that are identical and installed closely. They may be placed on both sides surrounding the sample under study (FIG. 3a), or wound around the sample under study (FIG. 3b). The two terminals of the coil 10 or coil pair 10 feed the signal $V_a(t)$ to the electronics 14 and 62; the two terminals of the coil 12 or coil pair 12 feed the signal $V_b(t)$ to the electronics 16 and 64 (see FIG. 4 and FIG. 6). Either $V_a(t)$ or $V_b(t)$ comprises the additive sum of the spin resonance emission signal noise $V_{SR}(t)$, $U_{B1}(t)$, and $V_n(t)$. $V_n(t)$ here represents all kinds of non-spin random noises emanated from the coils and later from the following electronics. $V_a(t)=V_{SRa}(t)+U_{B1a}(t)+V_{na}(t)$ and $V_b(t)=V_{SRb}(t)+U_{B1b}(t)+V_{nb}(t)$. $V_{SRa}(t)=V_{SRb}(t)$ and $U_{B1a}(t)=U_{B1b}(t)$, but $V_{na}(t) \neq V_{nb}(t)$. $V_{SR}(t)$, $U_{B1}(t)$ and $V_n(t)$, are mutually independent statistically. Furthermore, $V_{na}(t)$ is statistically independent with $V_{nb}(t)$.

3. Description of the Continuous Precision NMR and MRI

The fundamental parameters in NMR or MRI applications are spin magnetic resonance line profile (power spectrum) $S(v)$, spin number density $\rho$, spin-lattice (longitudinal) relaxation time $T_1$, and spin-spin (transverse) relaxation time $T_2$. Other parameters required in some special NMR/MRI may be derived from these measurements.

In general, the above parameters are functions of positions x, y, and z in the sample volume, thus requiring 1-D, 2-D or 3-D imaging. The samples in NMR applications usually are homogeneous throughout the sample volume, rendering these parameters free of variations in the volume.

3-1. Nuclear Magnetic Resonance Spectroscopy (NMR)

The tasks for NMR applications are in general to obtain $\rho$, $T_1$, $T_2$, and the detailed high-resolution spin resonance spectrum of a homogenous sample under investigation. If spatial distributions of these parameters are sought, it becomes the tasks of magnetic resonance imaging (MRI).

FIG. 4 shows the schematic of the data generation, acquisition, processing, and reduction in NMR applications. Block 20 contains NMR major hardware equipment, such as the magnet for field $B_o$, the RF transmitter coil for establishment of the transverse RF field $B_1$ (block 22), and the receiver coil sets. The sample under study is placed in the static field $B_o$. There is no gradient field there, since no imaging or spin localization is required. In block 20 of FIG. 4, there are two identical sets of receiver coil as described above and illustrated in FIGS. 3a and 3b. After placing a sample in the magnetic field $B_o$, magnetic resonance emissions of the spins in the sample naturally occur, and thus generate two signals $V_a(t)$ and $V_b(t)$ at the terminals of the coil set #a and the coil set #b. For electronics 14, $V_a=V_{SRa}+V_{na}+U_{B1a}$; for electronics 16, $V_b=V_{SRb}+V_{nb}+U_{B1b}$. After separately passing through electronics 14 and 16 (electronics 14 and 16 are identical), $V_a(t)$ and $V_b(t)$ encounter in the auto/cross-correlator 24 for correlation. Correlator 24 acts as an auto-correlator for $V_{SR}$ and $U_{B1}$, yielding an auto-correlation function $R'(t)=R_{SR}(t)$ of $V_{SR}+R_{B1}(t)$ of $U_{B1}$, since $V_{SRa}=V_{SRb}$ and $U_{B1a}=U_{B1b}$. For statistically independent $V_{na}(t)$ and $V_{nb}(t)$, correlator 24 acts as a cross-correlator, yielding correlation function $R_n(t)=0$. Thus $R'(t)=R_{SR}(t)+R_{B1}(t)+R_n(t)=R_{SR}(t)+R_{B1}(t)$. Only $R_{SR}(t)$ is needed for NMR applications. $R_{B1}(t)$ must be removed from $R'(t)$. This is the task of the correction block 26 in FIG. 4. Its input is the contaminated auto-correlation $R'(t)$, after correction its output is $R(t)=R_{SR}(t)$. This is the case when the static field $B_o$ and the RF field $B_1$ both are present. When the RF field $B_1$ not applied, $U_{B1}(t)=0$ and no $R_{B1}(t)$, then the correction block 26 may become unnecessary. This invention uses correlation to practically eliminate the interfering effects of the non-spin signal noises $V_n(t)$, hence greatly enhances system's SNR.

Once $R(t)$ has been obtained, the Wiener-Khinchin theorem Eq.(5), and Eq.(6) yield the spin resonance spectrum $S(v)$ and the spin resonance frequency $v_o$. Eq.(7) precisely calculates the relaxation time $T_{SR}$ from $R(t)$, and Eq.(8) brings forth the spin number density $\rho$.

If only $S(v)$, $\rho$ and $T_1$ are required, the RF field $B_1$ in the above procedure is not necessary to apply. Without $B_1$, $S(v)$, $\rho$, and $T_1$ may come from one set of measurements. On the other hand, if relaxation time $T_2$ is also needed, the above procedure must repeat twice to generate two $R(t)$ at two different $B_1$ values (one of the two $B_1$ values may be set to 0). Two $R(t)$ yield two $T_{SR}$ with Eq.(7). Using these two $T_{SR}$, relaxation times $T_1$, and $T_2$ can be obtained by solving two Eq.(3) simultaneously, one for the first $B_1$ and one for the second $B_1$.

This transverse RF $B_1$ field built up by the transmitter coil ought to be uniform throughout the entire sample volume. It is a continuous steady-state RF $B_1$ field, its bandwidth should be substantially wider, e.g. ~3 orders of magnitude wider, than the bandwidths of the spin resonance emissions. The strength for this field $B_1$ can be selected in accordance with the gyro-magnetic ratio $\gamma$ and the estimated relaxation times $T_1$ and $T_2$ of the sample. Usually only a very low $B_1$ field is needed.

3-2. Nuclear Magnetic Resonance Imaging (MRI)

The tasks of MRI applications are to obtain the spatial distributions, i.e., 1-D, 2-D or 3-D images of spin density $\rho$, spin-lattice relaxation time $T_1$, and spin-spin relaxation time $T_2$ of samples, such as tissues and human bodies, etc. The spin resonance frequency usually is a known parameter. To this end, a special apparatus or device for spin spatial localization must be available prior to MRI measurements. This kind of apparatus may partially be adapted from the existing MRI system, or adapted from whatever means that can serve this spin localization purpose.

As conceptually delineated for 1-D case in FIG. 5a, this kind of apparatus sorts out a thin rod-like slender volume 50 in a slice 52 of height z and thickness $\Delta z$. Along volume's longitudinal y dimension, a monotonic increasing (or decreasing), z-direction frequency-encoding magnetic field $B_e(y)$ (54 in FIG. 5b) is built up by the apparatus, so that each voxel with coordinate y in this slender volume is assigned a unique magnetic field $B_e=B_e(y)$, and consequently a corresponding spin resonance frequency $v_e(y)=\gamma[B_o+B_e(y)]/2\pi$. In this way, each and every voxel in this volume can be localized by its unique spin resonance frequency $v_e(y)$. Thus the 1-D resonance imaging can be realized. Sweeping this slender volume over the entire slice 52 generates a 2-D image; same sweeping fashion but for slices at various height z generates a 3-D image.

FIG. 6 shows the schematic of the MRI applications. Like the NMR applications in FIG. 4, block 60 is the MRI machine equipment including the two identical sets of receiver (detection) coil surrounding the sample (FIG. 3) to induce two identical spin resonance emission noise signals $V_{SRa}(t)$ and $V_{SRb}(t)$ that, along with non-spin signal noise $V_n(t)$ and $B_1$'s cross-coupling voltage $U_{B1}(t)$, are fed to the electronics 62 and 64 (62 and 64 are duplicate). The correlator 66 serves as auto-correlation for $V_{SRa}(t)+U_{B1a}$ and $V_{SRb}(t)+U_{B1b}$; but serves as cross-correlation for the random noises $V_{na}$ and $V_{nb}$. Correlation of $V_{na}$ and $V_{nb}$ practically equals zero due to their statistical independency. The auto-correlation function R'(t) from correlator 66 is the sum of auto-correlation $R_{SR}(t)$ of $V_{SR}$ and auto-correlation $R_{B1}(t)$ of $U_{B1}$. $R_{B1}(t)$ is unwanted, and should be removed from R'(t). This is the task of the correction block 68. The output of the correction 68 is the desired auto-correlation function R(t) of the spin resonance emission noise signal $V_{SR}(t)$, from which the MRI parameters can be derived as illustrated in FIG. 6.

Because of the linearity of the Fourier transform and the statistical independency among all spin resonance emission noise signal $V_{SRk}(t)$ of the k-th voxel, k=1, 2, ..., N (N=total number of voxels in the volume 50 of FIG. 5), R(t) is the sum of all component auto-correlation function $R_k(t)$ of $V_{SRk}(t)$. Each $R_k(t)$ has a unique carrier frequency $v_k$ depending on voxel's position $y_k$ and $B_e(y_k)$. This fact makes multichannel bandpass filtering 70 either using computer algorithm or using electronic device) in FIG. 6 possible. The outputs of the filter 70 are separated $R_k(t)$ for each k-th spin voxel, k= 1, 2, ..., N. $T_{1k}$, $T_{2k}$, $S_k(v)$, and $\rho_k$ can then be derived from $R_k(t)$, using the same procedures and equations as explained in the NMR section. $T_{1k}=T_1(y_k)$, $T_{2k}=T_2(y_k)$, and $\rho_k=\rho(y_k)$, that is the 1-D imaging. The spatial resolution $\Delta y$ in this 1-D image depends upon the gradient of field $B_e(y)$ and the channel bandwidth $\Delta v$, $\Delta y = 2\pi \Delta v (dy/\gamma dB_e)$.

As mentioned before, here the obtained $T_1$, $T_2$, and $\rho$ are their true values, not the "weighted" $T_1$, $T_2$ and $\rho$. Certainly, these true $T_1$, $T_2$, and $\rho$ can be blended up using a pre-assigned mixing ratio to form any "weighted" imaging.

When the RF $B_1$ field is applied, its strength can be selected in accordance with the gyro-magnetic ratio $\gamma$ and the estimated relaxation times $T_1$ and $T_2$ of the sample. Usually only an extremely low $B_1$ field is needed. In medical MRI, the field $B_1$ may be on the order of 0.01 Gauss.

Both in FIG. 4 and FIG. 6, the electronics shown in the blocks 14, 16 and 62, 64 contains amplifiers, mixers, etc. A/D (anolog-to-digital) converters also can be included, or may be placed somewhere else.

4. Continuous Precision NMR/MRI Using Single Set of Receiver Coil

The foregoing descriptions are about using two identical receiver (detection) coil sets to generate two signals $V_a$ and $V_b$ that serve as two inputs to the auto-correlation. In fact, this continuous precision NMR/MRI technology can also be performed using single set of receiver coil. In such cases, the receiver coils are the same as those employed in the conventional NMR/MRI machines.

FIGS. 7a-7c delineate three possible embodiments using single receiver coil set. The NMR/MRI signals come from the receiver coil 74, 76 or 78. The other function blocks are the same as in FIG. 4 and FIG. 6. Those blocks that follow the blocks 82 are not shown in FIGS. 7a-7c.

The underlying principles of these three embodiments are the same with those utilizing dual identical receiver coil sets in FIGS. 4 and 6.

The embodiment in FIG. 7a is the simplest, yet its correlator 80 cannot eliminate any non-spin signal noises emanated from the coil and all electronics. Their effects will be removed in the correction block 82. The embodiment in FIG. 7b cannot eliminate any non-spin signal noises emanated from the coil and the pre-amplifier. The embodiment in FIG. 7c cannot eliminate non-spin signal noises emanated from the receiver coil, but all electronic noises from the electronics 88 and 90 are cancelled out in correlation 92. In FIG. 7b, a path-length adjustment may be needed to compensate the path-length difference between the path through the mixer only and the path through the electronics 94. Without this compensation, the maximum R'(t) could appear a little bit away from t=0.

5. Correction of Correlation R'(t) for the Spin Resonance Emission Correlation R(t)

As shown in FIGS. 4, 6, and 7a-7c, the task for the correction block is to correct R'(t) to obtain R(t), i.e., to extract R(t) from R'(t). Here R(t) and R'(t) represent the auto-correlation function of the spin resonance noise signals and the auto-correlation function of the spin resonance noise signals plus other non-spin signals, respectively. R(t) is the desired auto-correlation function; R'(t) may be called the contaminated auto-correlation function. The task of correction can be stated generally as follows.

An auto-correlation function $R'(t)=R(t)+R_n(t)$. R(t) and $R_n(t)$ represent the auto-correlation functions of a random (or deterministic) signal V(t) and another random (or deterministic) signal $V_n(t)$, respectively. V(t) must be statistically independent to $V_n(t)$. Assume that the power spectral bandwidth for $V_n(t)$ is much broader, e.g. ~2-3 orders of magnitude broader, than the bandwidth for V(t). Thus, according to the reciprocity inequality for relaxation time and spectral bandwidth [13], the damping-off rate of $R_n(t)$ is much quicker, ~2-3 orders of magnitude quicker, than the damping-off rate of R(t). Or in terms of relaxation times, the relaxation time T of $R_n(t)$ is much shorter, ~2-3 orders of magnitude shorter, than the relaxation time T of R(t)s.

FIGS. 8a-8c shows these features. FIGS. 8a and 8b plot the R(t) curve of V(t) and the $R_n(t)$ curve of $V_n(t)$. Only the envelopes of their positive halves are plotted. In the figures, relaxation time=0.1 sec for V(t) and relaxation time=0.0002 sec for $V_n(t)$. Hence, the normalized damping-off rate of $R_n(t)$ is ~500-fold faster than that of R(t). At t~0.0015 sec, R(t) virtually equals R(0), but $R_n(t)$ already asymptotes to 0, although intentionally setting $R_n(0)=100\times R(0)$ (FIG. 8b). In FIG. 8c, curve #1 (a'-b'-c-d-e) is $R'(t)=R(t)+R_n(t)$, derived from the measurement data; curve #2 (a-b-c-d-e) is R(t)—the one ought to be extracted from curve #1. (Note the coordinate scales are very different in FIG. 8a and FIG. 8b.) Significant discrepancies between curve #1 and curve #2 only occur in the immediate vicinity around t=0.

Therefore, a three-step correction procedure can be carried out as follows:

(1) Discard the segment of the correlation function R'(t) derived from the measurements from t=0 (point a) to t=$t_c$ (point c). Having known the bandwidth of $V_n(t)$, $t_c$ can be well estimated. In FIG. 8c, $t_c$ may take around 0.002 sec.

(2) Find a curve equation numerically by curve-fitting based on the R'(t) data from point c to point e in FIG. 8c.

(3) Extrapolate R'(t) numerically from t=$t_c$ to t=0 using the curve equation obtained in step (2). Now this R'(t) is the corrected one, equal to R(t) at every moment of time.

In the above description, V(t) represents the nuclear spin magnetic resonance emission signal $V_{SR}(t)$, $V_n(t)$ represents all non-spin signal noise $V_N(t)$ plus the $B_1$-related voltage $U_{B1}(t)$. In NMR and MRI, the bandwidths of single spin signal $V_{SR}(t)$ are very narrow, generally from tenths Hz to tens Hz. The bandwidths of electronics noises $V_N(t)$ are easily a few orders of magnitude wider than the bandwidths of the spin signal $V_{SR}(t)$. In MRI, the bandwidth of the RF field $B_1$ has to cover the spin resonance frequencies of all voxels in volume 50 of FIG. 5, further the bandwidth of $V_{B1}(t)$ can be purposely made a few orders wider than the combined bandwidths of spin signals $V_{SR}(t)$. In NMR, the bandwidth of $V_{B1}(t)$ can also be purposely devised a few orders wider than the bandwidth of spin signal $V_{SR}(t)$. In each of the above cases, therefore, this correction scheme can be implemented.

6. Two Special Features of the Continuous Precision NMR and MRI

One particularly unique feature of the present invention may be seen in MRI applications. A RF field $B_1$ on the order of 0.01 Gauss means that the RF power deposited into a patient's body that is under MRI procedure only amounts to less than $10^{-8}$ of the RF power deposited into a patient's body in the pulsed MRI. A RF power reduction factor of $10^{+8}$ is of vital significance with regard to patient safety issue.

Another particularly unique feature of the present invention may be seen in NMR applications. Due to the continuous operating nature, the spin resonance emission signal, in principle, can be uninterruptedly measured without time limit. According to the fast Fourier transform, the spectral resolution of a spectrum is inversely proportional to the available length of time of the measured signal. Hence, for example, a 100 or 1000 second-long signal may result in 0.01 or 0.001 Hz resolution, respectively. Such hyperfine resolutions have significant utility in NMR research.

7. The Continuous Precision ESR

Parallel to nuclear spin magnetic resonance, there is electron spin magnetic resonance (ESR or EPR). Similar to NMR, electron spin magnetic resonance is also a spectroscopic technique that detects species having unpaired electrons, but it is not as widely used as NMR. NMR and ESR share the similar basic theories and technical concepts. One apparent difference of NMR and ESR is the resonance frequency: radio frequencies for NMR and microwave frequencies for ESR. Therefore, the method of the present invention also can be applied to electron spin magnetic resonance. In doing so, of course, the electronics needs to be modified to accommodate the microwave environment.

The invention claimed is:

1. A method for performing nuclear magnetic resonance (NMR) of a target under investigation, comprising:
    generating continuously nuclear spin magnetic resonance random emission radiations by placing the target in a NMR-pertinent magnetic environment;
    detecting continuously spin resonance random emission radiations from the target and all non-spin radiations as raw NMR signals;
    conditioning said detected raw NMR signals;
    correlating said conditioned raw NMR signals to obtain true NMR emission auto-correlation function; and
    retrieving spin resonance properties of the target from said NMR emission auto-correlation function.

2. The method of claim 1, wherein said NMR-pertinent magnetic environment comprises a static homogenous magnetic field $B_0$, whose direction is designated as the z-direction.

3. The method of claim 1, wherein said NMR-pertinent magnetic environment comprises a composite of two magnetic fields: (1) a static homogenous magnetic field $B_0$, whose direction is designated as the z-direction; and (2) a transverse to the $B_0$ direction steady continuous radio-frequency magnetic field $B_1$, wherein the strength of said field $B_1$ is significantly lower than the strength of said static field $B_0$, and the frequency range of said field $B_1$ covers the target's spin resonance frequencies in said field $B_0$.

4. The method of claim 1, wherein detecting NMR spin resonance emission radiations comprises: (1) utilizing a single set of a detecting/receiving device to induce a single set of said raw NMR signal, which is divided into two parts of signals before to be correlated; or (2) utilizing dual sets of a detecting/receiving device, which are such arranged around the target that two sets of raw NMR signals, in which two sets of NMR spin emission signals are practically identical, are induced at their output terminals.

5. The method of claim 1, wherein retrieving spin resonance properties of the target from said NMR emission auto-correlation function comprises:
    calculating spin resonance properties, including spin resonance power spectrum, spin lattice relaxation time, spin-spin relaxation time, spin resonance frequency, and spin number density, of the target from said NMR emission auto-correlation function using relevant equations and procedures.

6. The method of claim 1, wherein conditioning said detected raw NMR signals comprises amplifying including pre-amplifying, frequency-converting which is optional and is carried out before correlating or after correlating, and analog-to-digital converting which is carried out either before correlating or after correlating, such that the conditioned raw NMR signals are suitable to be correlated.

7. The method of claim 1, wherein correlating said conditioned raw NMR signals to obtain true NMR emission auto-correlation function comprises:
    correlating said conditioned raw NMR signals to obtain raw NMR auto-correlation function; and
    correcting said raw NMR auto-correlation function, if necessary, to obtain true NMR emission auto-correlation function.

8. The method of claim 7, wherein correcting said raw NMR auto-correlation function to obtain true NMR emission auto-correlation function, further comprises correction scheme and computer readable computer code.

9. A method for performing nuclear magnetic resonance imaging (MRI) of a target under investigation, comprising:
    generating continuously nuclear spin magnetic resonance random emission radiations by placing the target in a MRI-pertinent magnetic environment;
    detecting continuously spin resonance random emission radiations from the target and all non-spin radiations as raw MRI signals;
    conditioning said detected raw MRI signals;
    correlating said conditioned raw MRI signals to obtain true MRI emission auto-correlation function; and
    constructing spin resonance property images of the target from said MRI emission auto-correlation function.

10. The method of claim 9, wherein detecting MRI spin resonance emission radiations comprises: (1) utilizing a single set of a detecting/receiving device to induce a single set of said raw MRI signal, which is divided into two parts of signals before to be correlated; or (2) utilizing dual sets of a detecting/receiving device, which are such arranged around the target that two sets of raw MRI spin signals, in which two sets of MRI emission signals are practically identical, are induced at their output terminals.

11. The method of claim 9, wherein said MRI-pertinent magnetic environment comprises a composite of two magnetic fields: (1) a static homogeneous magnetic field $B_0$, whose direction is designated as the z-direction; and (2) a steady spin-localization magnetic field $B_e$, whose direction is on the z-axis.

12. The method of claim 11, wherein said spin-localization magnetic field $B_e$ further comprises a frequency-encoding single-valued continuous or discrete or partially continuous and partially discrete magnetic field available along a single or multi slender line volume in the target, such that each spin voxel along said slender line volume is assigned a sole and distinct $B_e$ strength according to each spin voxel's sole location along said slender line volume or slender line volumes, such that said single or multi slender line volume field $B_e$ may or may not be capable to be scanned across a slice or slices in the target.

13. The method of claim 11, wherein said spin-localization magnetic field $B_e$ further comprises a frequency-encoding single-valued continuous or discrete or partially continuous and partially discrete magnetic field available in a thin slice in the target, such that each spin voxel in said slice is assigned a sole and distinct $B_e$ strength according to each spin voxel's sole location in said slice, such that said thin slice field $B_e$ may or may not be capable to be scanned across the target volume.

14. The method of claim 11, wherein said static field $B_0$ in the composite of two magnetic fields is set to null, and said RF field $B_1$ strength is significantly lower than the lowest strength of said spin-localization magnetic field $B_e$.

15. The method of claim 9, wherein said MRI-pertinent magnetic environment comprises a composite of three magnetic fields: (1) a static homogeneous magnetic field $B_0$ whose direction is designated as the z-direction; (2) a steady spin-localization magnetic field $B_e$ whose direction is on the z-axis; and (3) a transverse to said $B_0$ direction steady continuous radio-frequency magnetic field $B_1$, wherein the strength of said field $B_1$ is significantly lower than the strength of said static field $B_0$, and the frequency range of said field $B_1$ covers the target's all relevant spin resonance frequencies in the combined fields of $B_0$ and $B_e$.

16. The method of claim 15, wherein said spin-localization magnetic field $B_e$ further comprises a frequency-encoding single-valued continuous or discrete or partially continuous and partially discrete magnetic field available along a single or multi slender line volume in the target, such that each spin voxel along said slender line volume is assigned a sole and distinct $B_e$ strength according to each spin voxel's sole location along said slender line volume or slender line volumes, such that said single or multi slender line volume field $B_e$ may or may not be capable to be scanned across a slice or slices in the target.

17. The method of claim 15, wherein said spin-localization magnetic field $B_e$ further comprises a frequency-encoding single-valued continuous or discrete or partially continuous and partially discrete magnetic field available in a thin slice in the target, such that each spin voxel in said slice is assigned a sole and distinct $B_e$ strength according to each spin voxel's sole location in said slice, such that said thin slice field $B_e$ may or may not be capable to be scanned across the target volume.

18. The method of claim 15, wherein said static field $B_0$ in the composite of three magnetic fields is set to null, and said RF field $B_1$ strength is significantly lower than the lowest strength of said spin-localization magnetic field $B_e$.

19. The method of claim 9, wherein conditioning said detected raw MRI signals comprises amplifying including pre-amplifying, frequency-converting which is optional and is carried out before correlating or after correlating, and analog-to-digital converting which is carried out either before correlating or after correlating, such that the conditioned raw MRI signals are suitable to be correlated.

20. The method of claim 9, wherein correlating said conditioned raw MRI signals to obtain true MRI emission auto-correlation function comprises:
correlating said conditioned raw MRI signals to obtain raw MRI auto-correlation function; and
correcting said raw MRI auto-correlation function, if necessary, to obtain true MRI emission auto-correlation function.

21. The method of claim 20, wherein correcting said raw MRI auto-correlation function to obtain true MRI emission auto-correlation function, further comprises correction scheme and computer readable computer code.

22. The method of claim 9, wherein constructing spin resonance property images of the target from said MRI emission auto-correlation function, comprises:
decomposing said MRI emission auto-correlation function to extract component MRI emission auto-correlation functions for each and every spin voxel involved in the target;
calculating spin resonance properties, including spin resonance power spectrum, spin-lattice relaxation time, spin-spin relaxation time, spin resonance frequency, and spin number density, from said component MRI emission auto-correlation functions of each voxel involved in the target using relevant equations and procedures; and
mosaicking said spin resonance properties of all voxels according to their sole and distinct locations in the target to form 1-D or 2-D or 3-D spin magnetic resonance images.

23. The method of claim 22, wherein decomposing said MRI emission auto-correlation function further comprises multi band-pass filtering said MRI emission auto-correlation function to obtain component MRI emission auto-correlation functions for each and every spin voxel involved, one band for one voxel.

24. A method for performing nuclear magnetic resonance (NMR) of a target under investigation, comprising:
generating continuously spin magnetic resonance random emission radiations by placing the target in a NMR-pertinent magnetic environment;
detecting continuously spin resonance random emission radiation from the target and all non-spin radiations as raw NMR signal;
conditioning said detected raw NMR signal to produce true NMR emission signal, which is practically free from all non-spin signals and suitable to be further processed;
obtaining NMR emission power spectrum from said conditioned NMR emission signal; and
retrieving spin resonance properties of the target from said NMR emission power spectrum.

25. The method of claim 24, wherein conditioning said detected raw NMR signals to produce true NMR emission signal that is practically free from all non-spin signals comprises:
suppressing and/or controlling, using any available techniques and means including cryogenic detecting and amplifying, all non-spin signals in said raw NMR signal to a level such that the final NMR retrieval properties have pre-determined accuracies.

26. The method of claim 24, wherein retrieving spin resonance properties of the target from said NMR emission power spectrum, comprises:
fourier-transfroming said NMR emission power spectrum to acquire NMR emission auto-correlation function; and
calculating NMR properties from said NMR emission auto-correlation function using relevant equations and procedures.

27. A method for performing nuclear magnetic resonance imaging (MRI) of a target under investigation, comprising:
generating continuously spin magnetic resonance random emission radiations by placing the target in a MRI-pertinent magnetic environment;
detecting continuously spin resonance random emission radiation from the target and all non-spin radiations as raw MRI signal;

conditioning said detected raw MRI signal to produce true MRI emission signal, which is practically free from all non-spin signals and suitable to be further processed;

obtaining MRI emission power spectrum from said conditioned MRI emission signal; and constructing spin resonance property images of the target from said MRI emission power spectrum.

28. The method of claim 27, wherein conditioning said detected raw MRI signals to produce true MRI emission signal which is practically free from all non-spin signals comprises:

suppressing and/or controlling, using any available techniques and means including cryogenic detecting and amplifying, all non-spin signals in said raw MRI signal to a level such that the final MRI constructions have pre-determined accuracies.

29. The method of claim 27, wherein constructing spin resonance property images of the target from said MRI emission power spectrum, comprises:

fourier-transforming said MRI emission power spectrum to acquire MRI emission auto-correlation function;

decomposing said MRI emission auto-correlation function to obtain component MRI emission auto-correlation functions for each and every spin voxel involved;

fourier-transforming said component MRI emission auto-correlation functions to acquire component MRI emission power spectrum of each and every spin voxel involved;

calculating spin resonance properties of each voxel from said component MRI emission auto-correlation functions of each voxel involved using relevant equations and procedures; and mosaicking said spin resonance properties of all voxels according to their sole and distinct locations in the target to form 1-D or 2-D or 3-D spin resonance images.

30. A method for performing electron spin magnetic resonance and its imaging of a target under investigation, comprising:

generating continuously electron spin magnetic resonance random emission radiations by placing the target in a pertinent magnetic environment;

detecting continuously spin resonance random emission radiation and all other non-spin radiations as raw electron spin resonance signals;

conditioning said detected raw electron spin resonance signals so that conditioned raw electron spin resonance signals are suitable to be employed in following data processing;

correlating said conditioned raw electron spin resonance signals to obtain true electron spin resonance emission auto-correlation function, or spectral analyzing said conditioned raw electron spin resonance signals to obtain true electron spin resonance emission power spectrum; and retrieving electron spin resonance properties or constructing electron spin resonance property images of the target from said electron spin resonance emission auto-correlation function or electron spin resonance emission power spectrum using relevant equations and procedures.

31. A spin resonance signal detecting/receiving apparatus for performing nuclear spin magnetic resonance and its imaging or performing electron spin magnetic resonance and its imaging of a target under investigation comprising:

two sets of detecting/receiving devices, each set comprising a detecting coil or loop or rod, for detecting/receiving two sets of raw spin resonance signal, each of which includes spin magnetic resonance emission radiation from the target and all other non-spin radiations, said two sets of detecting/receiving devices being positioned around the target such that said two sets of spin magnetic resonance emission radiations in said two sets of raw spin resonance signals are effectively identical and are used in spin resonance and spin resonance imaging data processing.

* * * * *

UNITED STATES PATENT AND TRADEMARK OFFICE
CERTIFICATE OF CORRECTION

Page 1 of 2

PATENT NO.        : 7,772,845 B2
APPLICATION NO.   : 12/114708
DATED             : August 10, 2010
INVENTOR(S)       : Feng It is certified that error appears in the above-identified patent and that said Letters Patent is hereby corrected as shown below:

Face Page, Other Publications Section, please include number references as indicated in brackets below for certain references:
Goodman, Joseph W., Statistical Optics, pp. 164-169, Wiley-Interscience Publication, John Wiley & Sons.[15]
Melissinos, Adrian; Napolitano, Jim; Experiments in Modern Physics 2nd Ed. Ch. 7 pp. 251-293. [17]
Page 2, Other Publications Section, please include number references as indicated in brackets below for certain references:
Wolf, Mandel E., Coherence Properties of Optical Fields, Review of Modern Physics, Apr. 1965 vol. 37, No. 2. [14]
Rushworth, F.A., Tunstall, D.P.; Nuclear Magnetic Resonance Ch. 2 pp. 20-27.[9]
Andrew, E.R., Nuclear Magnetic Resonance, 1955 pp. 16-21; Cambridge at the University Press. [10]
Cowan, Brian, Nuclear Magnetic Resonance and Relaxation, pp. 62-67. [8]
Bloch, F., Nuclear Induction, Physical Review, 1946, pp. 460-474, vol. 70, Nos. 7 & 8, Oct. 1 and 15. [7]
Bloembergen, N., Purcell, E.M., Pound, R.V., Relaxation Effects in Nuclear Magnetic Resonance Absorption, Physical Review, Apr. 1, 1948, pp. 697-712, vol. 73, No. 7. [6]
Lauterbur, P.C., Image Formation by Induced Local Interactions: Examples Employing Nuclear Magnetic Resonance, Oct. 30, 1972, State University of New York at Stoney Brook. [4]
Bloch, F., Hansen, W.W., Packard, Martin, Nuclear Induction, Jan. 29, 1946 at Stanford University. [1]
Purcell, E.M., Torrey, H.C., Pound, R.V., Resonance Absorption by Nuclear Magnetic Moments in a Solid, Mass. Inst. of Tech., Dec. 24, 1945. [2]
Damadian, Raymond, Tumor Detection by Nuclear Magnetic Resonance, State University of New York, Brooklyn, Oct. 12, 1970. [3]
Bendat, Julius S., Piersol, Allan G., Random Data Analysis and Measurement Procedures 3rd. Ed., pp. 120-135, 2003. [12]
Born, Max, Wolf, Emil, Principles of Optics: Electromagnetic Theory of Propagation, Signed and Sealed this
Twenty-sixth Day of July, 2011

David J. Kappos
*Director of the United States Patent and Trademark Office*

Interference and Diffraction of Light, pp. 536-539, 1959, Pergamon Press. [13]
    Column 7, line 1, Equation (4) by changing $d\tau$ to $d_i$.
    Column 7, line 22, Equation (6): please add $v$ before $s^2(v)dv$

UNITED STATES PATENT AND TRADEMARK OFFICE
CERTIFICATE OF CORRECTION

| | | |
|---|---|---|
| PATENT NO. | : 7,772,845 B2 | Page 1 of 2 |
| APPLICATION NO. | : 12/114708 | |
| DATED | : August 10, 2010 | |
| INVENTOR(S) | : Feng | |

It is certified that error appears in the above-identified patent and that said Letters Patent is hereby corrected as shown below:

Face Page, Other Publications Section, please include number references as indicated in brackets below for certain references:

Goodman, Joseph W., Statistical Optics, pp. 164-169, Wiley-Interscience Publication, John Wiley & Sons.[15]

Melissinos, Adrian; Napolitano, Jim; Experiments in Modern Physics 2nd Ed. Ch. 7 pp. 251-293. [17]

Page 2, Other Publications Section, please include number references as indicated in brackets below for certain references:

Wolf, Mandel E., Coherence Properties of Optical Fields, Review of Modern Physics, Apr. 1965 vol. 37, No. 2. [14]

Rushworth, F.A., Tunstall, D.P.; Nuclear Magnetic Resonance Ch. 2 pp. 20-27.[9]

Andrew, E.R., Nuclear Magnetic Resonance, 1955 pp. 16-21; Cambridge at the University Press. [10]

Cowan, Brian, Nuclear Magnetic Resonance and Relaxation, pp. 62-67. [8]

Bloch, F., Nuclear Induction, Physical Review, 1946, pp. 460-474, vol. 70, Nos. 7 & 8, Oct. 1 and 15. [7]

Bloembergen, N., Purcell, E.M., Pound, R.V., Relaxation Effects in Nuclear Magnetic Resonance Absorption, Physical Review, Apr. 1, 1948, pp. 697-712, vol. 73, No. 7. [6]

Lauterbur, P.C., Image Formation by Induced Local Interactions: Examples Employing Nuclear Magnetic Resonance, Oct. 30, 1972, State University of New York at Stoney Brook. [4]

Bloch, F., Hansen, W.W., Packard, Martin, Nuclear Induction, Jan. 29, 1946 at Stanford University. [1]

Purcell, E.M., Torrey, H.C., Pound, R.V., Resonance Absorption by Nuclear Magnetic Moments in a Solid, Mass. Inst. of Tech., Dec. 24, 1945. [2]

Damadian, Raymond, Tumor Detection by Nuclear Magnetic Resonance, State University of New York, Brooklyn, Oct. 12, 1970. [3]

This certificate supersedes the Certificate of Correction issued July 26, 2011.

Signed and Sealed this
Eleventh Day of October, 2011

David J. Kappos
*Director of the United States Patent and Trademark Office*

Bendat, Julius S., Piersol, Allan G., Random Data Analysis and Measurement Procedures 3rd. Ed., pp. 120-135, 2003. [12]

Born, Max, Wolf, Emil, Principles of Optics: Electromagnetic Theory of Propagation, Interference and Diffraction of Light, pp. 536-539, 1959, Pergamon Press. [13]

Column 7, line 1, Equation (4) by changing $d\tau$ to $dt$.

Column 7, line 19, Equation (5) by changing $d\tau$ to $dt$.

Column 7, line 27, Equation (6): please add $v$ before $s^2(v)dv$.